United States Patent [19]
Foss

[11] Patent Number: 5,742,544
[45] Date of Patent: Apr. 21, 1998

[54] WIDE DATABUS ARCHITECTURE

[75] Inventor: Richard C. Foss, Kirkcaldy Fife, United Kingdom

[73] Assignee: Mosaid Technologies Incorporated, Kanata, Canada

[21] Appl. No.: 226,034

[22] Filed: Apr. 11, 1994

[51] Int. Cl.⁶ .................................................. G11C 7/00
[52] U.S. Cl. ...................... 365/189.03; 365/149; 365/207
[58] Field of Search ..................... 365/189.02, 189.03, 365/207, 149

[56] References Cited

U.S. PATENT DOCUMENTS

| | | | |
|---|---|---|---|
| 4,208,730 | 6/1980 | Dingwell et al. | 365/181 |
| 4,558,435 | 12/1985 | Hsieh | 365/203 |
| 4,926,382 | 5/1990 | Sakui et al. | 365/149 X |
| 5,258,957 | 11/1993 | Seta et al. | 365/189.01 X |
| 5,280,450 | 1/1994 | Nakagome et al. | 365/189.03 |
| 5,353,255 | 10/1994 | Komuro | 365/149 X |

Primary Examiner—Do Hyun Yoo
Attorney, Agent, or Firm—E. E. Pascal; R. A. Wilkes

[57] ABSTRACT

A dynamic random access memory (DRAM) having pairs of bitlines, each pair being connected to a first bit line sense amplifier, wordlines crossing the bitline pairs forming an array, charge storage cells connected to the bitlines, each having an enable input connected to a wordline, the bit line sense amplifiers being connected in a two dimensional array, pairs of primary databuses being connected through first access transistors to plural corresponding bit line sense amplifiers in each row of the array, apparatus for enabling columns of the first access transistors, databus sense amplifiers each connected to a corresponding data bus pair, a secondary databus, the secondary databus being connected through second access transistors to the databus sense amplifiers, and apparatus for enabling the second access transistors, whereby each the primary databus pair may be shared by plural sense amplifiers in a corresponding row of the array and the secondary databus may be shared by plural primary databus pairs.

6 Claims, 4 Drawing Sheets

WIDE DATABUS ARCHITECTURE

FIELD OF THE INVENTION

This invention relates to the field of integrated semiconductor memories, and in particular to the structure of a very large dynamic random access memory (DRAM).

BACKGROUND TO THE INVENTION

A semiconductor DRAM is typically comprised of parallel pairs of bitlines crossing wordlines. A charge storage cell is located adjacent intersections of the bitlines and wordlines, each cell being comprised of a charge storage capacitor connected for access to a bitline through a cell access field effect transistor (FET), which FET is enabled from a wordline. Each bitline pair is connected to a sense amplifier, which is connected via an access transistor, enabled by a Y-decoder, to a databus. The databuses are located on the chip in parallel to the wordlines and parallel to a strip of associated sense amplifiers, and orthogonal to the bitlines. Read and write amplifiers are connected to the databuses.

As the capacity of DRAMs increases, it becomes increasingly important to minimize the size of the chip in which it is integrated, in order to increase yields and to decrease the cost per bit of the DRAMS.

SUMMARY OF THE INVENTION

The present invention is a DRAM structure which significantly decreases the physical space used on a chip for a given size of DRAM, and at the same time provides a structure that can accommodate a significantly increased memory capacity for a given chip size. It can provide wider data buses providing greater bandwidth which is useful for application specific memories (ASMs) or embedded memories in ASIC devices. In such an application a wide databus could be used directly without further decoding, since data need not go off-chip which is limited by the number of pins on an integrated circuit chip package. The present invention avoids the requirement for separate databuses for each strip of sense amplifiers, but instead connects two or more sense amplifiers in different strips to primary databus pairs, and the databus pairs, through databus sense amplifiers, to a secondary databus which preferably runs in parallel to columns of the DRAM. Strips of bit line sense amplifiers are connected to the primary databus through access FETs which are enabled by a column array select signal.

The databus sense amplifiers are connected to the secondary databus by second access transistors, which may be enabled by Y-decoders. Indeed additional databus sense amplifiers may be connected in parallel through isolation FETs to the primary databuses and to the second access transistors. With enabling or inhibiting of the isolation FETs, selectable columns of databus sense amplifiers may be enabled, whereby they may be used as page caches, storing pages of databits for writing to or having been read from columns of storage cells.

Thus the primary databuses are shared among many arrays. Since plural parallel databuses each associated with a column of bit line sense amplifiers are not required, significant chip space is saved. The databus sense amplifiers can serve as caches, and in the plural parallel databus sense amplifier embodiment, the databus sense amplifiers can hold multiple pages of data in cache.

In accordance with an embodiment of the invention, a DRAM is comprised of an array of bitline sense amplifiers, columns of said bitline sense amplifiers being selectable by array select signals for application of charge between a selected column of bitline sense amplifiers and corresponding primary databus pairs, whereby each row of bitline sense amplifiers shares the same primary databus pair, and further comprising databus sense amplifiers for application of charge between a databus pair and a secondary databus.

In accordance with another embodiment, the DRAM described above further includes plural databus sense amplifiers connected in parallel through isolation apparatus to each primary databus pair and apparatus for enabling and inhibiting columns of the plural databus sense amplifiers together to connect and disconnect the columns of the plural databus sense amplifiers to corresponding databus pairs, whereby selectable columns of the plural sense amplifiers may be connected to the primary databus pairs.

In accordance with another embodiment of the invention, a dynamic random access memory (DRAM) is comprised of pairs of bitlines, each pair being connected to a bit line sense amplifier, wordlines crossing the bitline pairs forming an array, charge storage cells connected to the bitlines, each having an enable input connected to a wordline, the bit line sense amplifiers being connected in an array, pairs of primary databuses being connected through first access transistors to plural corresponding bit line sense amplifiers in each row of the array, apparatus for enabling columns of the first access transistors, databus sense amplifiers each connected to a corresponding data bus pair, a secondary databus, the secondary databus being connected through second access transistors to the databus sense amplifiers, and apparatus for enabling the second access transistors, whereby each primary databus pair may be shared by plural sense amplifiers in a corresponding row of the array and the secondary databus may be shared by plural primary databus pairs.

In accordance with another embodiment, the DRAM described above further includes plural databus sense amplifiers connected in parallel through isolation apparatus to each primary databus pair and to the second access transistors, and apparatus for enabling and inhibiting columns of the plural databus sense amplifiers to connect and disconnect the columns of the plural databus sense amplifiers together to corresponding databus pairs, whereby columns of the plural sense amplifiers may be connected to and sense the corresponding databus pairs.

BRIEF INTRODUCTION TO THE DRAWINGS

A better understanding of the invention will be obtained by reading the description of the invention below, with reference to the following drawings, in which:

FIG. 1 is a diagram of part of a DRAM in accordance with the prior art,

FIG. 2 is a diagram of part of a DRAM in accordance with a preferred embodiment of the present invention, FIGS. 3A and 3B are timing diagrams used in illustrating reading and writing in the preferred embodiment, FIG. 4 is a diagram of part of the DRAM in accordance with another embodiment of the present invention, and FIG. 5 is a diagram of part of a DRAM illustrating two additional embodiments of the invention.

DETAILED DESCRIPTION OF THE INVENTION

Figure 1:
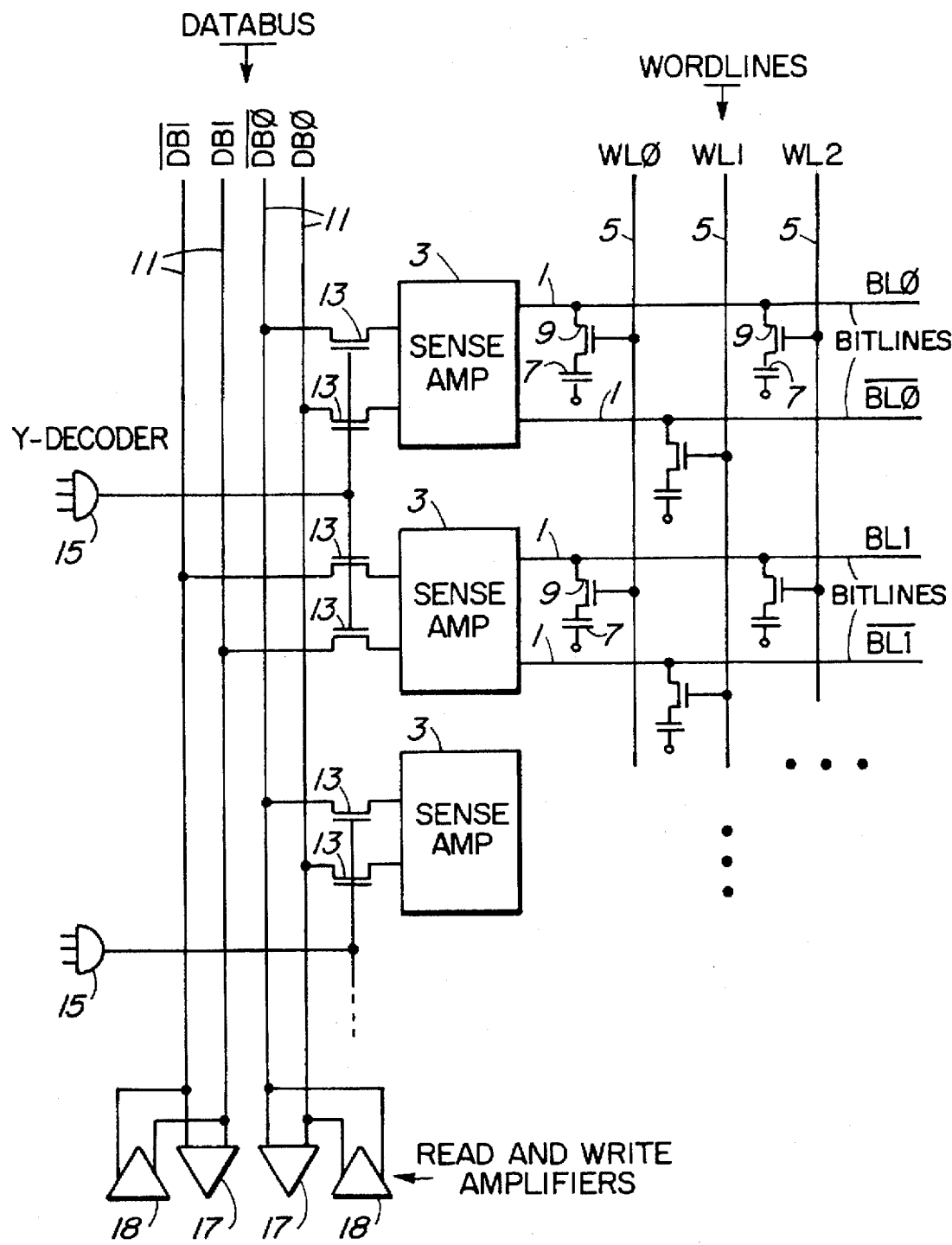

Referring to FIG. 1, in a prior art DRAM bit line pairs 1 are connected to bit line sense amplifiers 3. Word lines 5 cross the bit lines, and charge storage cells comprised of charge storage capacitors 7 in series with cell access transistors 9 (FETs) are located adjacent the intersection of the wordlines and the bit lines. The transistors 9 are enabled by the adjacent word lines 5.

The sense amplifiers are connected to databus lines 11 via databus access transistors (FETs) 13. FETs 13 are enabled from the outputs of Y-decoders 15. Read amplifiers 17 and write amplifiers 18 are connected to the databus lines 11.

As is well known, data arriving on the databus via the write amplifiers are sensed by the sense amplifiers and full logic level of the data is applied to the bit lines 1. Upon enabling of FETs 9 from one of the word lines, charge on the associated bit lines is passed through the FETs to the charge storage capacitors, thereby completing a write cycle.

To perform a read cycle, a sense amplifier is enabled, a bit line pair is precharged, and a logic level is applied to a word line. An FET is thereby enabled, allowing the charge on a cell capacitor to be dumped to the associated bit line. The sense amplifier senses the charge, restores full logic level into the cell and drives the databus. The resulting signal on the databus is passed through a databus read amplifier.

Figure 2:
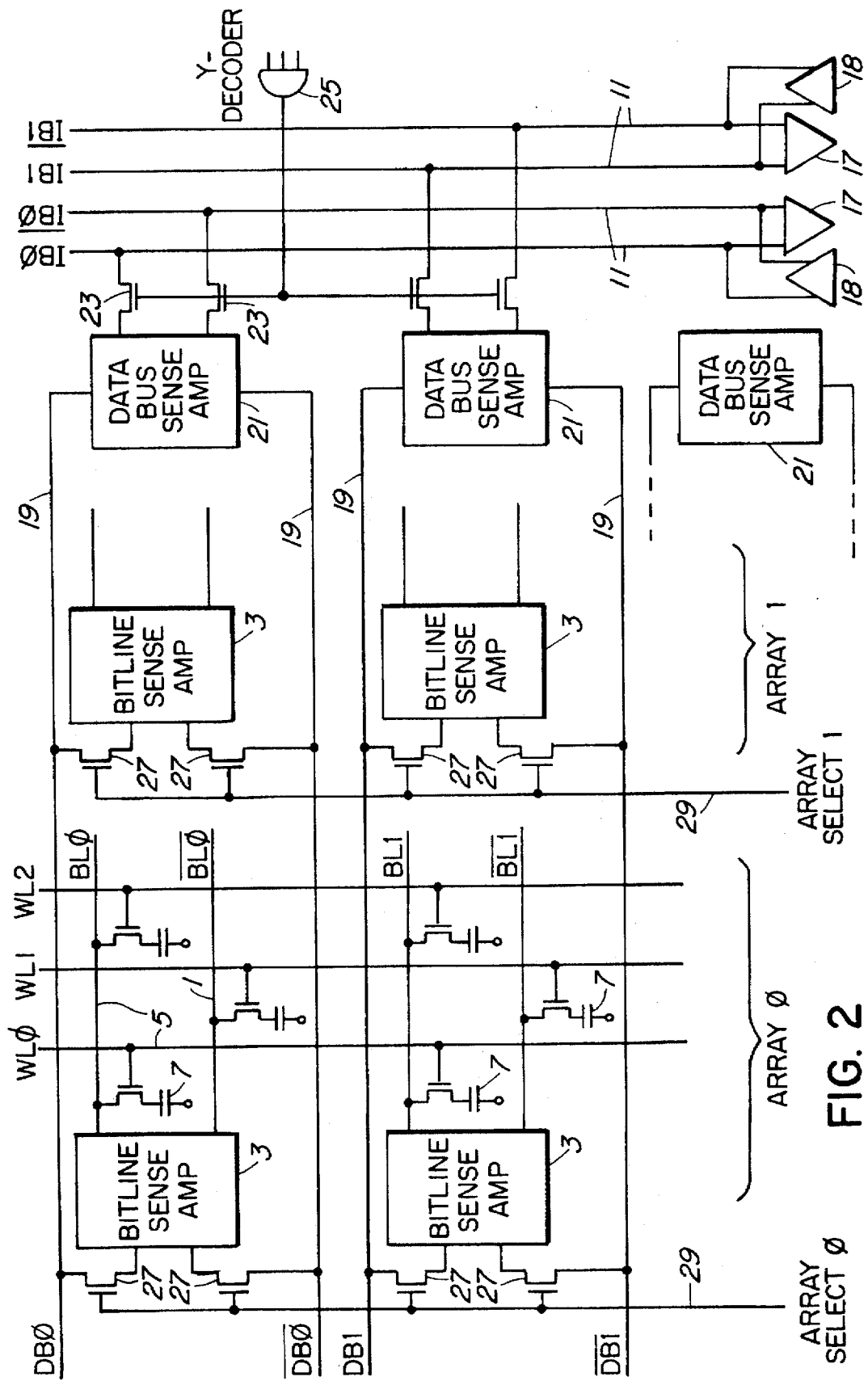

An embodiment of the present invention is illustrated in FIG. 2. The databus 11 of FIG. 1 is now referred to as a secondary databus 11, to which read and write amplifiers 17 and 18 are connected as in the prior art. However, access to databus 11 is made not directly from the sense amplifiers, but from primary databus pairs 19. The primary databus pairs 19 run in rows, each pair preferably on opposite sides of a row of bit line sense amplifiers 3. In one embodiment, each of the primary databus pairs 19 is connected to a pair of lines of the secondary databus 11 via a databus sense amplifier 21. The structure of the databus sense amplifiers is similar to a bit line sense amplifier; one will be shown and described in schematic form in FIG. 4. Each databus sense amplifier is connected to a primary databus pair, and via a pair of second access transistors 23 to a pair of lines of secondary databus 11. In this manner opposite polarity logic pairs of primary databuses DB0, /DB0, DB1, /DB1 may be connected to opposite polarity logic pairs of secondary databus lines IB0, /IB0, IB1, /IB1.

A Y-decoder 25 is connected to the gates of second access FETs 23 connected to each pair of databus sense amplifiers 21 connected to opposite logic pairs of primary databuses. Read amplifiers 17 and write amplifiers 18 are connected to each pair of secondary databus lines 11.

Each bit line sense amplifier is connected to a primary databus pair 19, which run in parallel to the bit lines, through primary databus access transistors (FETs) 27. FETs 27 connected to bit line sense amplifiers 3 in a column have their gates connected together and to an array select logic line 29, i.e. Array Select 0, Array Select 1, etc., each associated with an array of charge storage cells 7 enabled by a group of word lines.

Figure 3A:
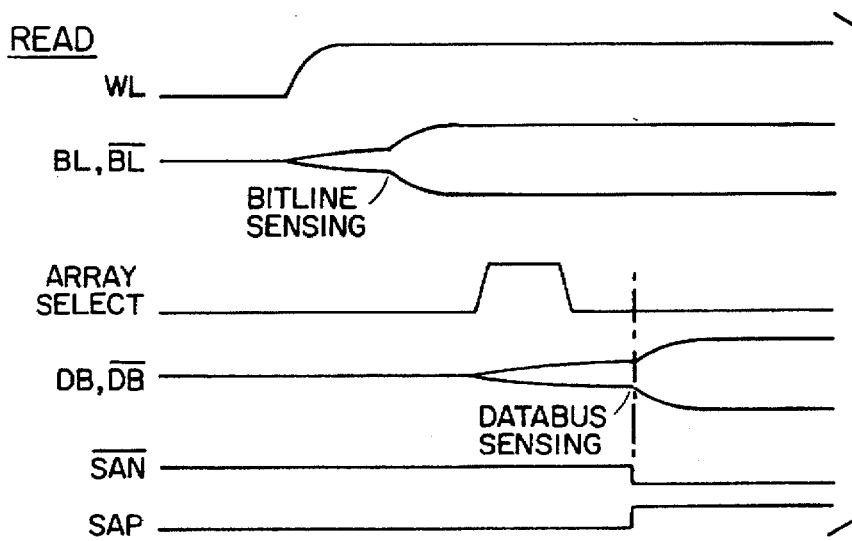
Figure 3B:
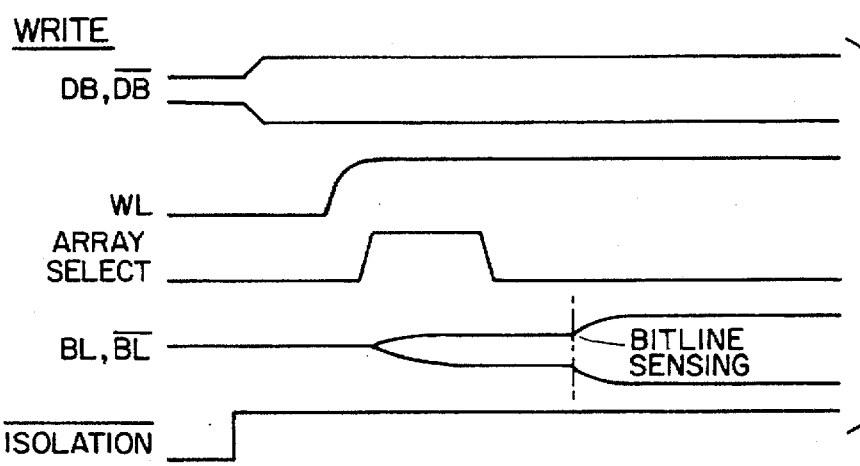

Consider now FIGS. 3A and 3B to understand operation of the embodiment shown in FIG. 2. To read data stored in the charge cells, a word line 5 (WL) is first enabled. The charge stored in the memory cell is transferred to the bitline, and then at the time indicated as "bit line sensing", the bit lines are sensed by bit line sense amplifier 3. The bit lines 1 (BL, /BL) are rapidly charged to full logic level.

Following sufficient time to charge, a logic signal is applied to an array select line 29 (e.g. Array Select 0) for an interval, which enables FETs 27. Once FETs 27 are conductive, the databus pair 19 begins to charge slowly from the bit lines. The databus pair is then sensed by the databus sense amplifier 21, resulting in rapid increase of the databus pair voltage to full logic level (DB, /DB).

In this way the data stored in an entire array of bitline sense amps, representing many thousands of bits in a modern DRAM, can be transferred to an array of databus sense amplifiers in a single operation.

With application of an address to Y-decoder 25, addressing FETs 23, the logic levels on selected databus pairs are transferred to pairs of lines of the secondary databus 11, for reading by read amplifier 17.

To write to the memory (FIG. 3B), opposite polarity logic levels are written to the secondary databus pairs by write amplifiers 18 (DB /DB). The databus sense amplifiers 21 are enabled by Y-decoder 25 receiving and decoding an address signal. With enabling of the sense amplifiers, the logic levels on the secondary databus are sensed, and the logic levels (DB, /DB) of the databus pairs 19 are brought to full logic level.

A logic signal is then applied to a word line (WL), followed by enabling of the primary databus access FETs 27 by an array select signal. The charge on the associated databus pair 19 slowly rises, followed by sensing by the bit line sense amplifier 3. The bit line pair voltage then rapidly changes to opposite polarities of full logic level on each bit line of the pair (BL, /BL). With the word line selected, the cell access FETs 7 are enabled, and the charge on each bit line passes through the associated cell access FET to its cell capacitor, for storage.

It may thus be seen that the primary databuses are shared by many arrays, thus saving significant chip area, since the databuses of the prior art (analogous to the secondary databus of this embodiment) are not required in each array.

It should be noted that the secondary databus may be located as a central spine in the DRAM, with primary databuses leading orthogonally in orthogonally opposite directions therefrom, and the DRAM arrays disposed in mirror image on both sides of the spine. There may be two separate parallel secondary databuses, or both may share the same secondary databus in a time shared manner. Sharing of a secondary databus by two mirror image DRAM arrays is possible by simply addressing the Y-decoders to control which primary databus pair of which DRAM array has access to the secondary databus at a particular time.

In accordance with another embodiment, plural databus sense amplifiers are connected in parallel to each bit line pair, but each isolated from the bit line pair by an isolation device such as an FET.

Figure 4:
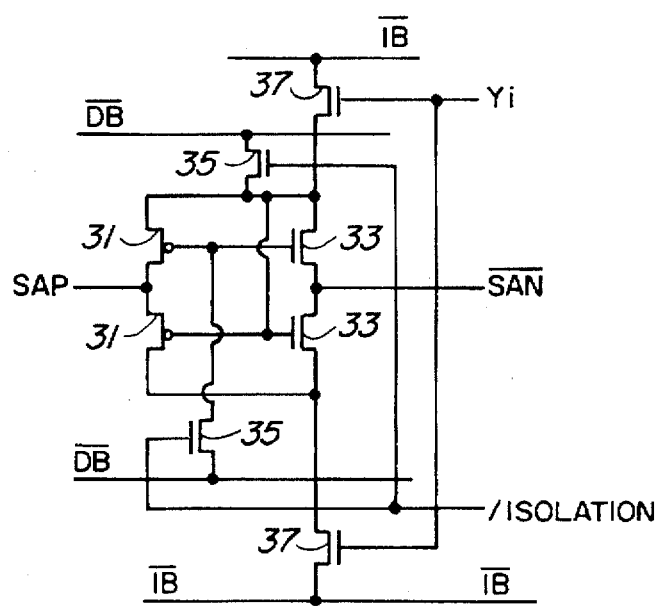

A databus sense amplifier suitable for parallel connection is shown in FIG. 4. A pair of FETs 31 of one conductivity type each has its gate connected to a corresponding FET of a pair of FETs 33 of opposite conductivity type. The gate of one of the FETs of one conductivity type is connected to one databus DB of the databus line pair through an optional isolation FET 35, and the gate of the other of the FETs of the one conductivity type is connected to the other databus /DB of the databus pair through a similarly optional isolation FET 35. The FETs 35 are enabled (made conductive) by an /ISOLATION logic level applied to their gates.

In operation, any column of databus sense amplifiers may be used by applying an /ISOLATION logic level to the gates of FETs 35, while an ISOLATION (inhibit) logic level is applied to the gates of FETs 35 of all other columns of databus sense amplifiers. This provides means for selection of which sense amplifiers are used to sense the bit line pairs in a read operation or the secondary databus for application of data logic levels to the bit line pairs in a write operation.

Since each sense amplifier stores the logic level of a bit, each strip of sense amplifiers can store a page of bits, and by enabling each column of sense amplifiers, multiple pages of bits may be stored in cache. This allows thousands of bits to be transferred in a single operation to cache registers.

Figure 5:
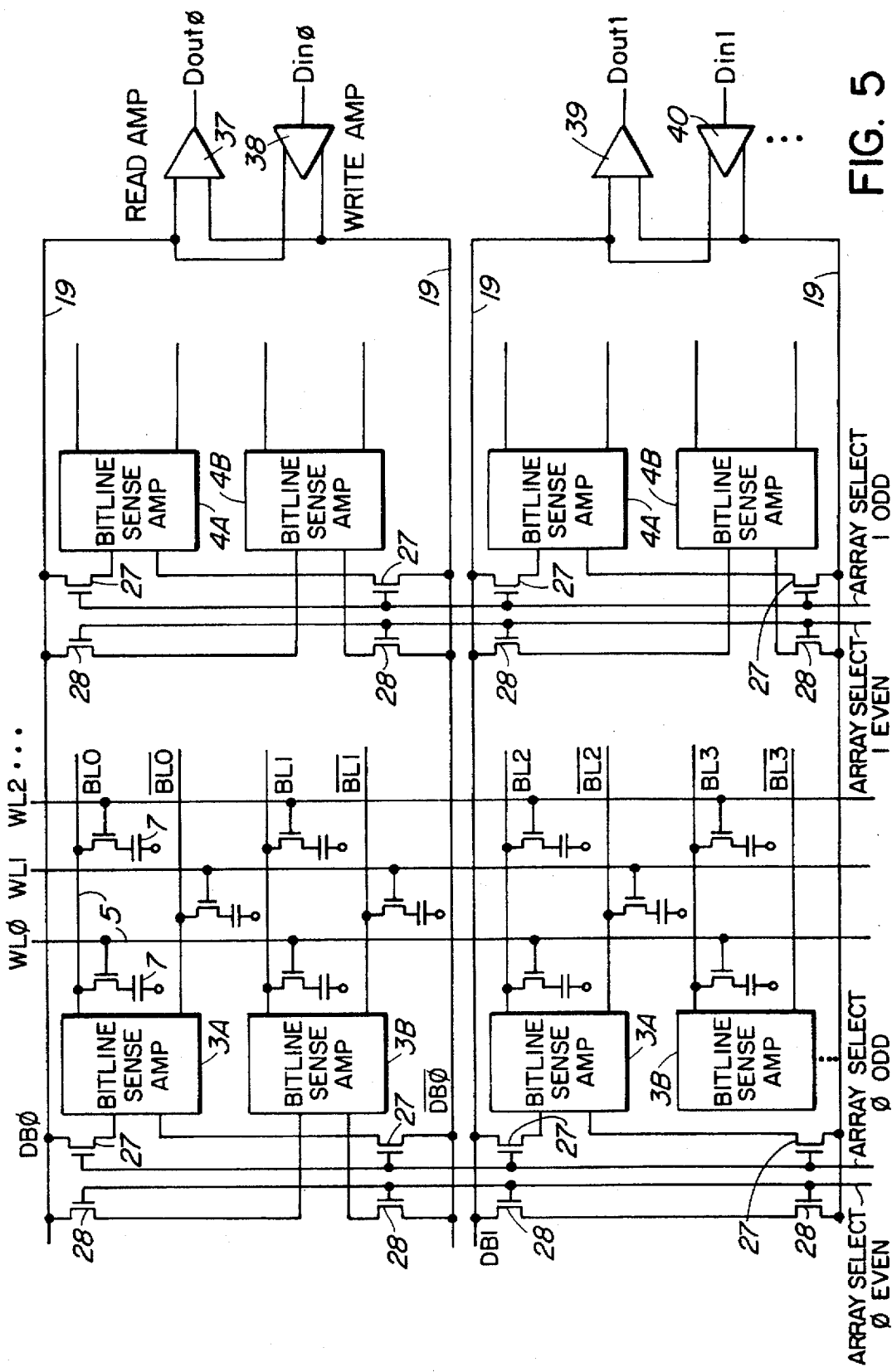

Additional embodiments are shown in FIG. 5. In this embodiment instead of databus pairs 19 being shared by a single row of bit line sense amplifiers, databus pairs 19 are shared (multiplexed) by more than one row of bit line sense amplifiers (two rows of bit line sense amplifiers being illustrated). FIG. 5 also illustrates direct databus sensing.

In respect of the latter embodiment, each databus pair 19 is connected to the input of a read amplifier 37, 39 and to the output of a write amplifier 38, 40 connected in parallel. No secondary databus is used, though the outputs Dout and inputs Din of the read and write amplifiers may be connected to a central column of conductors. The primary databuses may be either of the form described with reference to FIG. 2, or may be multiplexed as will be described below.

The read and write amplifiers operate to read and write the primary databuses directly, and no Y decoder need be used.

As noted above, the primary databuses may be multiplexed by more than one row of bit line sense amplifiers. Thus for example bit line sense amplifiers 3A and 3B, 4A and 4B, etc. share primary databuses 19. Multiplexed databuses 19 may be connected to a strip of data bus sense amplifiers 21 as shown in FIG. 2, or may be connected directly to read and write amplifiers as shown in FIG. 5.

FIG. 2 shows the bit line sense amplifiers being connected to associated databus 19 via FETs 27, which are enabled by an array select 0 or 1 logic signal being applied to their gates. In the present embodiment this is still the case for bit line sense amplifiers 3A and 4A, but bit line sense amplifiers 3B and 4B are connected to the databus 19 via FETs 28. A separate array select logic signal is applied to the gates of FETs 28, the latter being referred to as "array select 0 or 1, even", the former being referred to as "array select 0 or 1, odd".

In operation, to enable the strip of bitline sense amplifiers 3A to databus 19, an array select 0 odd logic signal is applied to the gates of FETs 27 associated with sense amplifiers 3A. To enable the strip of bitline sense amplifiers 4A, to access databus 19, an array select 1 odd logic signal is applied to the gates of FETs 27 associated with sense amplifiers 4A. To enable the strip of bitline sense amplifiers 3B to access the databus 19, an array select 0 even logic signal is applied to the gates of FETS 28 associated with bitline sense amplifiers 3B. To enable the strip of sense amplifiers 4B to access databus 19, an array select 1 even logic signal is applied to the gates of FETs 28 associated with the strip of bitline sense amplifiers 4B.

Thus the databus 19 may be multiplexed both by rows and columns of sense amplifiers.

A person understanding this invention may now Conceive of alternative structures and embodiments or variations of the above. All of those which fall within the scope of the claims appended hereto are considered to be part of the present invention.

I claim:

1. A semiconductor memory comprising bitlines and wordlines disposed orthogonally to each other, means for storing data associated with the wordlines and the bitlines, an array of bitline sense amplifiers connected to the bitlines, primary databases disposed parallel to the bitlines for connection to rows of said bitline sense amplifiers, and means for selectively connecting at least two rows of the sense amplifiers to each pair of said primary databases.

2. A semiconductor memory as defined in claim 1 comprising an application specific memory (ASM).

3. A semiconductor memory as defined in claim 1 comprising an embedded memory in an application specific integrated circuit (ASIC) device.

4. A semiconductor memory as defined in claim 1 further including secondary databases disposed orthogonally to the primary databases, and means for transferring data bits between the primary and secondary databases.

5. A semiconductor memory as defined in claim 4 in which said means for transferring data bits is comprised of first databus sense amplifiers, the semiconductor memory further including means for selectably isolating the first databus sense amplifiers from the secondary databases.

6. A semiconductor memory as defined in claim 5, including second databus sense amplifiers connected through said isolating means to the primary databases, and through access means to the secondary databases, whereby upon enabling or inhibiting of said isolating means, selectable columns of the first databus sense amplifiers are enabled, forming a page cache.

* * * * *